United States Patent
Dohi et al.

(10) Patent No.: US 9,997,326 B2
(45) Date of Patent: Jun. 12, 2018

(54) CHARGED PARTICLE BEAM DEVICE

(71) Applicant: Hitachi High-Technologies Corporation, Minato-ku, Tokyo (JP)

(72) Inventors: Hideto Dohi, Tokyo (JP); Akira Ikegami, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days. days.

(21) Appl. No.: 15/006,721

(22) Filed: Jan. 26, 2016

(65) Prior Publication Data

US 2016/0217967 A1    Jul. 28, 2016

(30) Foreign Application Priority Data

Jan. 26, 2015  (JP) ................. 2015-011931

(51) Int. Cl.
| | |
|---|---|
| *H01J 37/141* | (2006.01) |
| *H01J 37/21* | (2006.01) |
| *H01J 37/147* | (2006.01) |
| *H01J 37/28* | (2006.01) |

(52) U.S. Cl.
CPC ........ *H01J 37/141* (2013.01); *H01J 37/1471* (2013.01); *H01J 37/1472* (2013.01); *H01J 37/21* (2013.01); *H01J 37/28* (2013.01); *H01J 2237/04922* (2013.01); *H01J 2237/2448* (2013.01); *H01J 2237/2809* (2013.01)

(58) Field of Classification Search
CPC .... H01J 37/141; H01J 37/147; H01J 37/1471; H01J 37/1472; H01J 37/1478; H01J 37/21; H01J 37/28
See application file for complete search history.

(56) References Cited

U.S. PATENT DOCUMENTS

| | | | |
|---|---|---|---|
| 6,452,175 B1 | 9/2002 | Adamec | |
| 2011/0272578 A1* | 11/2011 | Hirose | H01J 37/153 250/310 |
| 2014/0021366 A1* | 1/2014 | Dohi | H01J 3/26 250/396 R |
| 2015/0340200 A1* | 11/2015 | Jiang | H01J 37/26 250/307 |
| 2016/0163502 A1* | 6/2016 | Li | H01J 37/28 250/307 |

FOREIGN PATENT DOCUMENTS

JP       2000-348658 A     12/2000

* cited by examiner

*Primary Examiner* — Eliza Osenbaugh-Stewar
(74) *Attorney, Agent, or Firm* — Crowell & Moring LLP

(57) ABSTRACT

In a charged particle beam device including an objective lens that focuses a charged particle beam; a first deflector that deflects the charged particle beam to emit the charged particle beam to a sample from a direction different from an ideal optical axis of the objective lens; and a second deflector that deflects a charged particle emitted from the sample, a charged particle focusing lens to focus the charged particle emitted from the sample is disposed between the sample and the second deflector and strengths of the objective lens and the charged particle focusing lens are controlled, according to deflection conditions of the first deflector.

7 Claims, 11 Drawing Sheets

CHARGED PARTICLE BEAM DEVICE

BACKGROUND OF THE INVENTION

1. Field of the Invention

The present invention relates to a charged particle beam device that emits a charged particle beam to a sample and more particularly, to a charged particle beam device that enables inclination emission of a beam.

2. Description of the Related Art

In a manufacturing process of a semiconductor device, a charged particle beam device to emit a charged particle beam to an LSI, detect a secondary electron generated from a sample, and perform dimension measurement or defect inspection of a pattern shape has been used. Particularly, a scanning electron microscope (SEM) has been used frequently. In the related art, performance improvement or cost reduction of the semiconductor device has been accomplished by improving an integration degree by miniaturization, but has approached the limit recently. A device having a three-dimensional structure has been manufactured to continuously improve the integration degree. Inspection and measurement devices that can acquire information of a height direction in addition to two-dimensional information according to the related art are needed to improve a yield of the three-dimensional device.

For this reason, it is thought that a beam is inclined (the beam is deflected from an ideal optical axis of the beam and the beam is emitted to a sample from a direction different from the ideal optical axis). A charged particle beam device that inclines the beam and emits the beam to the sample is disclosed in JP-2000-348658-A (corresponding to U.S. Pat. No. 6,452,175). In addition, a method in which deflection mechanisms of two steps to deflect charged particle beams in opposite directions in a converged magnetic field of an objective lens are provided to correct off-axis chromatic aberration generated when the charged particle beams are inclined to an off-axis portion of the objective lens to prevent degradation of resolution at the time of the beam inclination is disclosed in JP-2000-348658-A.

SUMMARY OF THE INVENTION

In the scanning electron microscope that emits the inclined beam to the sample and observes the sample, it is preferable to deflect the secondary electron to the off-axis portion and guide the secondary electron to the side of a detector, to perform determination or analysis of energy of the secondary electron and high-efficient signal detection. Meanwhile, after the secondary electron is emitted from the sample, the secondary electron is converged by the objective lens and diffuses. If the secondary electron showing such behavior is guided to a detection surface of the detector having a finite area or a secondary electron conversion electrode to generate the secondary electron (third-order electron) by collision of the electron (secondary electron), high-efficient detection cannot be performed depending on a diffusion degree. In addition, it has been founded by examination of the inventors that the beam inclination causes field curvature chromatic aberration to be generated in the objective lens, adjustment using the objective lens is needed to correct the field curvature chromatic aberration, and the behavior of the secondary electron is changed by the adjustment. The method to correct the aberration of a primary electron is disclosed, but a high-efficient detection method of the secondary electron is not disclosed in JP-2000-348658-A. In addition, in the method disclosed in JP-2000-348658-A, the primary electron is deflected greatly by deflectors of two steps provided in the objective lens and the aberration is cancelled in the objective lens. For this reason, the secondary electron is deflected more greatly in the objective lens in a direction opposite to a deflection direction of the primary electron and the high-efficient detection is not realized. To realize the high-efficient detection of the secondary electron, it is thought that an orbit of the secondary electron is appropriately controlled. In the method disclosed in JP-2000-348658-A, an influence of the deflection aberration of the deflector and the off-axis aberration of the objective lens is large. For this reason, it is difficult to control the orbit of the secondary electron independently without affecting an orbit of the primary electron at the time of the inclination.

Hereinafter, a charged particle beam device to realize both high-efficient detection of a secondary charged particle and suppression of a factor of degradation of resolution generated at the time of beam inclination is suggested. In addition, a charged particle beam device to realize suppression of high-order off-axis chromatic aberration generated at the time of beam inclination is suggested.

An aspect in order to achieve the above-mentioned object suggests a charged particle beam device including: an objective lens that focuses a charged particle beam emitted from a charged particle source; a first deflector that deflects the charged particle beam to emit the charged particle beam to a sample from a direction different from an ideal optical axis of the objective lens; and a second deflector that deflects a charged particle emitted from the sample, wherein a charged particle focusing lens to focus the charged particle emitted from the sample is disposed between the sample and the second deflector and the charged particle beam device includes a control device that controls strengths of the objective lens and the charged particle focusing lens, according to deflection conditions of the first deflector.

Further, another aspect in order to achieve the above-mentioned other object suggests a charged particle beam device including: an objective lens that focuses a charged particle beam emitted from a charged particle source; a first deflector that deflects the charged particle beam to emit the charged particle beam from a direction different from an ideal optical axis of the objective lens; an aberration correction unit that is disposed between the charged particle source and the objective lens; and an optical element that is disposed between the aberration correction unit and the objective lens and focuses the charged particle beam having passed through the aberration correction unit.

The present invention can realize both high-efficient detection of a secondary charged particle and suppression of a factor of degradation of resolution generated at the time of beam inclination. In addition, the present invention can realize suppression of high-order off-axis chromatic aberration generated at the time of beam inclination.

DESCRIPTION OF THE PREFERRED EMBODIMENTS

Figure 1:
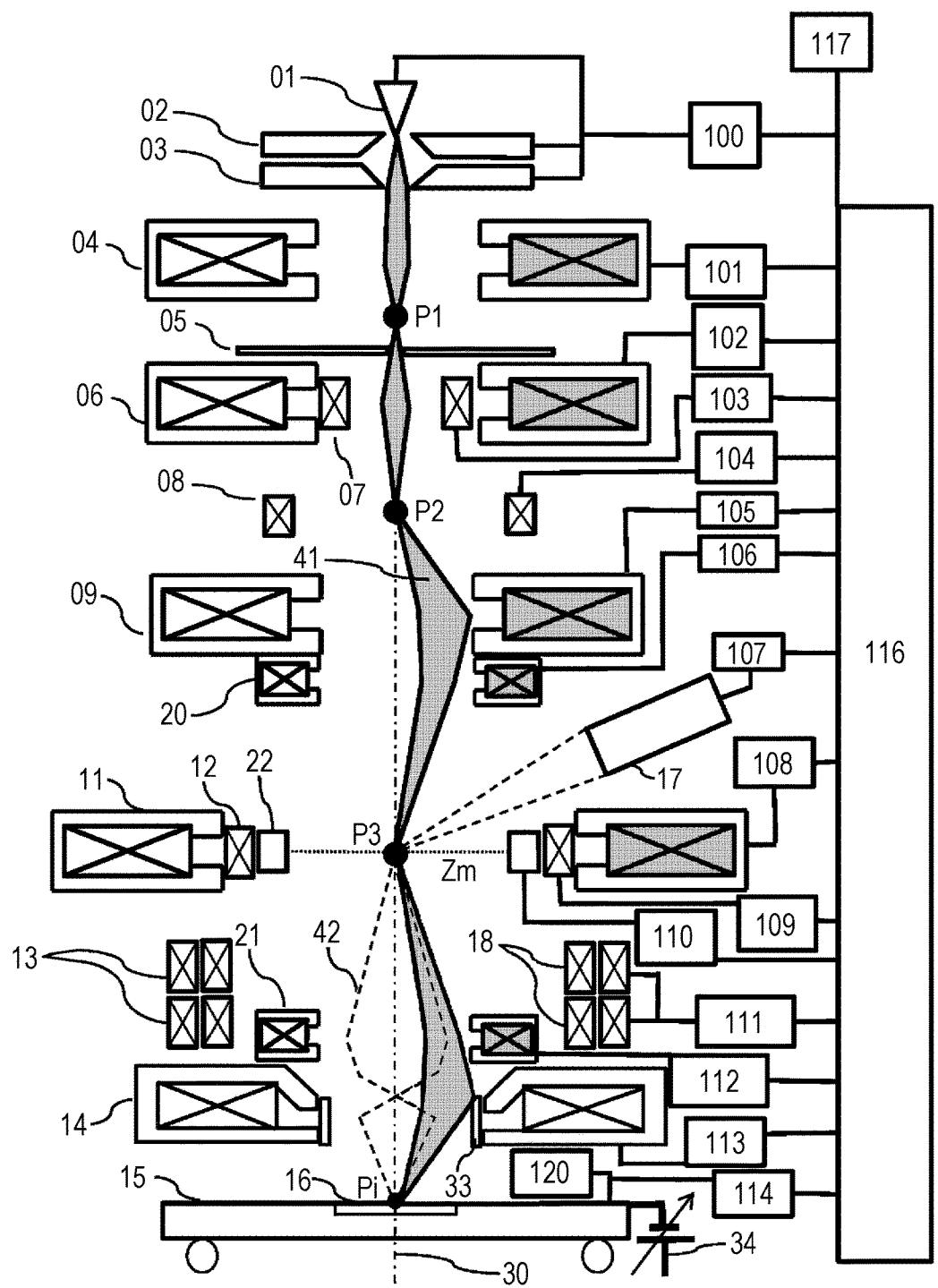
FIG. 1 is a diagram illustrating a configuration of an optical system of a scanning electron microscope (a schematic diagram of a first embodiment)

The embodiments described below relate to a charged particle beam device in which a beam can be inclined and more particularly, to a charged particle beam device for realizing suppression of aberration and high-efficient detection of a charged particle (secondary electron).

A pattern shape or a material of a semiconductor device is diversified and a request for analysis about secondary electrons such as improvement of a yield of the secondary electrons generated from a sample by emitting primary electron beams and material determination by energy determination increases in inspection and measurement thereof. A device having a function of controlling a secondary electron orbit to perform high-precision determination and analysis is required. Therefore, inspection, measurement, and analysis of a three-dimensional device having a multi-layered film structure in which different materials are stacked in a height direction are necessary and a request for a device capable of realizing both acquisition of an inclined image and secondary electron analysis at the time of inclination increases.

To obtain information of a height direction by the SEM, an image may be acquired by emitting an inclined beam to a sample. As a method of acquiring the inclined image by the SEM, there are a mechanical inclination method and an electrical inclination method. In addition, there is a method of mechanically inclining a sample stage or a column in in-line measurement/inspection. However, a working distance (WD) between an objective lens and the sample increases to prevent interference of a wafer and a column structure and a focal distance of the objective lens increases. For this reason, aberration of the objective lens cannot be decreased and resolution is degraded. In addition, a mechanical operation for inclining decreases reproducibility of the throughput, an observation position and an inclination angle.

Meanwhile, there is a beam inclination method of deflecting an electron beam by a deflector and inclining the electron beam with respect to the sample as the electrical inclination method. Because the electrical inclination method is superior to the mechanical inclination method, in terms of the reproducibility of the throughput or the inclination angle and variability of the inclination angle and the inclination direction, a SEM according to the electrical beam inclination method is preferable. However, in this method, if the beam is inclined, off-axis aberration of the objective lens increases, a beam diameter increases, and the resolution is degraded.

Therefore, in the embodiments to be described below, an SEM including an optical element that inclines a beam by a deflector (first deflector) and suppresses a factor of degradation of resolution generated according to inclination will be described. In addition, an SEM including an optical element that appropriately guides an orbit of a secondary electron deflected by an orthogonal electromagnetic field generator (hereinafter, referred to as an EXB) to generate a deflection electric field and a deflection magnetic field orthogonally or a deflector (second deflector) such as a Wien filter to the side of a detector without depending on inclination of a beam will be described. More specifically, it is necessary to arrange an orbit of incidence of a secondary electron on a spectroscope to determine energy of the secondary electron and improve analysis precision. In addition, it is necessary to guide maximum secondary electrons to a detection surface of the detector to increase a signal yield. However, if the secondary electron diffuses on the secondary electron deflector, the secondary electron receives an influence of secondary aberration, the orbit is changed greatly by a position on the EXB, incidence conditions necessary for the determination and the analysis of the high precision are not satisfied or the secondary electron diffuses on the detection surface excessively, and the yield decreases. For this reason, it is preferable to minimize geometric aberration with respect to the secondary electron by forming a focusing point of the secondary electron on the secondary electron deflector.

In addition, it is thought that field curvature generated when a beam passes through an off-axis portion of the objective lens is corrected by decreasing a current and a voltage of the objective lens at each inclination angle and adjusting the current and the voltage. However, lens action received in the secondary electron from the objective lens becomes weak together with the inclination angle and a focusing position of the secondary electron rises. For this reason, the secondary electron on the secondary electron deflector diffuses together with the inclination angle, the geometric aberration increases, and the determination precision is deteriorated. In addition, when the secondary electron is deflected at the time of the beam inclination, chromatic dispersion is generated in the primary electron, chromatic aberration of an element other than the objective lens is generated, and resolution at the time of the inclination is degraded.

In view of the above conditions, in the following embodiments, a charged particle beam device that includes a charged particle beam source to supply a charged particle beam, a plurality of condenser lens to control a focusing position and a focusing angle of the charged particle beam emitted from the charged particle beam source, an objective lens to focus the charged particle beam on a sample, a scanning unit to scan the sample with the charged particle beam, and a detector to detect a secondary electron generated from the sample by emission of the charged particle beam and inclines a beam, emits the beam to the sample, and acquires an inclined image, that is, a charged particle beam device that includes a deflector (inclination deflector: first deflector) to deflect a primary electron to incline a beam, a secondary electron deflector (second deflector) to be disposed on an objective lens, separate a secondary electron generated from a sample with a primary charged particle beam, and guide the secondary electron to a detector, a lens (secondary electron focusing lens: charged particle focusing lens) to be disposed between the sample and the secondary electron deflector and focus the secondary electron on a position of the secondary electron deflector, an aberration correction unit (aberration correction lens or an aberration generation multipole, an aberration generation deflector, and a high-order chromatic aberration suppression optical element to focus a primary electron beam having different energy on a principal surface of the objective lens) to be disposed on the secondary electron deflector and used when the beam is inclined, and a lens (aberration characteristic compensation lens) to be disposed on the secondary electron deflector and compensate for a change of an aberration characteristic by the secondary electron focusing lens will be described.

According to the above configuration, three-dimensional observation technology for enabling high-efficiency signal detection and high-precision material determination in inspection and measurement of a shape pattern of a semiconductor can be provided.

Hereinafter, a scanning electron microscope including a deflector for inclining a beam will be described using the drawings. In the following embodiments, the scanning electron beam is described as an example. However, the following embodiments can be applied to an ion beam emission device that emits an ion beam.

First Embodiment

FIG. 1 is a schematic diagram of an optical configuration according to a first embodiment. In the first embodiment, the case in which a deflector and a lens are used to generate aberration necessary for aberration correction of a primary electron at the time of beam inclination will be described.

First, the case in which the primary electron is vertically incident on a sample and a focusing position of a secondary electron is not controlled will be described. A voltage is applied between a cathode 01 and a first anode 02 by an electron gun control unit 100 and a primary electron 41 is emitted at a predetermined current density. An acceleration voltage is applied between the cathode 01 and a second anode 03 by the electron gun control unit 100 and the primary electron 41 is accelerated and is ejected to a rear step. After the primary electron 41 is focused on a point P1 on an optical axis 30 by a first condenser lens 04 controlled by a first condenser lens control unit 101, the primary electron 41 passes through an objective aperture 05 and unnecessary electrons are removed. A probe current amount of the primary electron 41 and an opening angle are determined by a position of the point P1 and a hole diameter of a diaphragm.

Then, a crossover of the primary electron 41 is formed on a point P2 on the optical axis 30 by a second condenser lens 06 controlled by a second condenser lens control unit 102. The point P2 is set to be matched with a center position of an aberration generation deflector 08. In addition, the primary electron 41 is incident on an aberration correction lens 09 controlled by an aberration correction lens control unit 105 and a crossover is formed on a point P3 on an object plane Zm of the objective lens. Because a high-order off-axis aberration suppression lens 11 is disposed on the object plane Zm as a center, the primary electron 41 does not receive lens action of the high-order off-axis aberration suppression lens 11.

In addition, the electromagnetic field strength of a secondary electron deflection EXB 22 controlled by a secondary electron deflection EXB control unit 110 is adjusted such that a center orbit of the primary electron 41 moves linearly.

In addition, the primary electron is incident on the objective lens 14 controlled by an objective lens control unit 113. The objective lens 14 has an opening to cause an electron beam to pass through the objective lens 14 and a center of the opening becomes an ideal optical axis of the electron beam (pass orbit of the electron beam when the beam is not deflected).

A booster electrode 33 controlled by the objective lens control unit 113 is disposed, an acceleration voltage is applied, and the aberration of the objective lens 14 is reduced. In addition, a deceleration voltage controlled by a retarding voltage control power supply 34 is applied to a stage 15 controlled by a stage control unit 115, a deceleration electric field is formed between the sample 16 and the objective lens 14, and the aberration of the objective lens 14 is further reduced. The primary electron 41 incident on the objective lens 14 is focused on a point Pi on the optical axis 30 on the sample 16 and forms a minute spot. The lens strength of the objective lens 14 is determined by the working distance measured by a sample height measurement device 120. The minute spot of the primary electron 41 emitted to the sample 16 scans the sample 16 two-dimensionally by a scanning deflector 13 controlled by a scanning deflector control unit 111.

At this time, the secondary electron 42 having the energy to be targeted in the secondary electron having the energy of a wide range generated by the primary electron 41 scanning the sample receives strong lens action by the objective lens 14. As a result, the secondary electron 42 is focused by action of a lens field of the sample side of the objective lens 14. Then, the secondary electron 42 receives action of the remaining lens field. At this time, the secondary electron 42 is focused on a certain place according to the working distance, the lens strength of the objective lens 14, the acceleration electric field, the acceleration electric field of the booster electrode 33, and the strength of the acceleration electric field of the sample 16. Then, the secondary electron 42 is deflected by the secondary electron deflection EXB 22 controlled by the secondary electron deflection EXB control unit 110, is incident on a detector 17 controlled by a detector control unit 107, and is detected as a signal. The detection signal is operated by an optical system control unit 116 and is displayed as an SEM image on an image display unit 117. When a visual field of the SEM image is moved, an arrival position of the primary electron 41 on the sample is changed by moving the sample stage controlled by the stage control unit 114 or operating an image shift deflector 18 controlled by the scanning deflector control unit 111. The control device 116 includes a storage medium not illustrated in the drawings and executes control described in the embodiments to be described, on the basis of optical conditions stored in the storage medium.

In this embodiment, a secondary electron focusing lens 21 is disposed below the secondary electron deflection EXB 22 and an aberration characteristic compensation lens 20 is disposed at the side opposite to the secondary electron focusing lens 21 with the object plane Zm of the objective lens 14 therebetween and at a position below the inclination deflector 12.

Ratios of aberration coefficients of deflection frame aberration and on-axis color aberration of an objective lens system and an aberration generation lens 09 need to be the same to correct primary off-axis chromatic aberration and deflection frame aberration of the primary electron at the time of the beam inclination simultaneously and a condition thereof is the following formula (1).

$$\frac{C_s^{OBJ}}{C_c^{OBJ}} = \frac{C_s^{COR}}{C_c^{COR}} \quad (1)$$

However, $C_s^{OBJ}$ and $C_c^{OBJ}$ show a spherical aberration coefficient and a chromatic aberration coefficient of a combined lens of the magnetic field of the objective lens 14 defined by the object plane Zm of the objective lens, the acceleration electric field by the booster electrode 33, and the retarding electric field, respectively. In addition, $C_s^{COR}$ and $C_c^{COR}$ show a spherical aberration coefficient and a chromatic aberration coefficient of the aberration generation lens 09 defined by the object plane Zm, respectively. In this embodiment, the aberration generation lens 09 in which the formula (1) is realized when the secondary electron focusing lens 21 and the aberration characteristic compensation lens 20 are OFF is disposed.

Figure 11A:
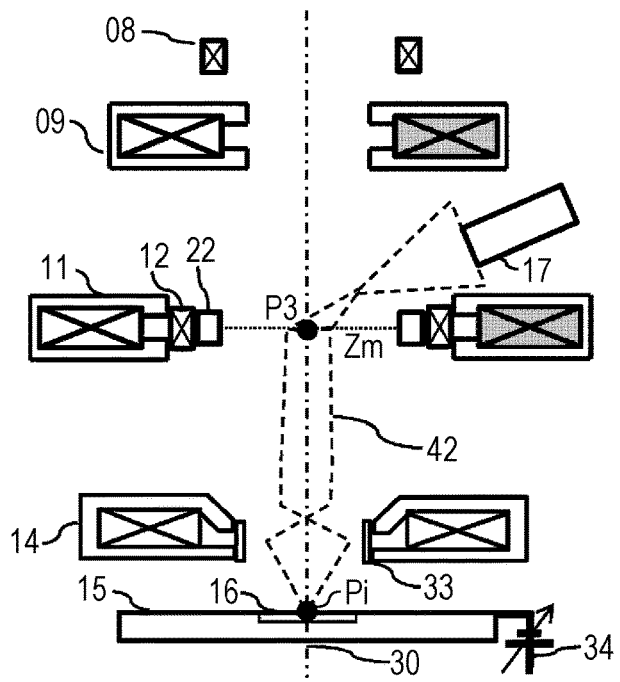
FIGS. 11A and 11B are diagrams illustrating adjustment of a focusing position of a secondary electron orbit in the first embodiment.

Next, a method of focusing the secondary electron 42 of the energy to be targeted on the center of the secondary electron deflection EXB 22 in the case in which an inclination angle is 0° will be described. FIG. 11A is a diagram illustrating a center orbit of the primary electron at the time of the beam inclination in the case in which the secondary electron focusing lens 21 and the aberration characteristic compensation lens 20 are OFF. The secondary electron 42 of the energy to be targeted is focused on a place shifted from the object plane Zm of the objective lens.

Figure 11B:
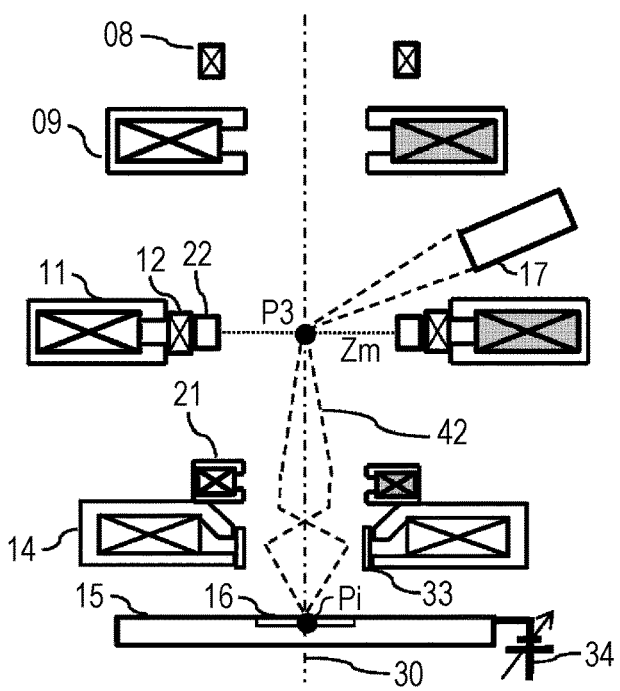

Next, a current and a voltage are applied to the secondary electron focusing lens 21 and the secondary electron focusing lens 21 is operated. At this time, the voltage and the current of the secondary electron focusing lens 21 change according to a current change of the objective lens 14. Because the energies of the primary electron and the secondary electron are greatly different, refractive powers by the same lens are different. The strengths of the objective lens 14 and the secondary electron focusing lens 21 are adjusted simultaneously, such that the secondary electron 42 is focused on the point P3 on the object plane Zm of the objective lens 14 while the primary electron is focused on the point Pi on the sample (refer to FIG. 11B).

The secondary electron focusing lens 21 is operated, so that the objective lens system at the time of the beam inclination becomes a combined lens by four parties of the objective lens 14, the booster electrode 33, the retarding electric field, and the secondary electron focusing lens 21. Therefore, the spherical aberration coefficient and the chromatic aberration coefficient of the objective lens system are changed by the electromagnetic field of the secondary electron focusing lens 21. Because the strength of the electromagnetic field is different according to each inclination angle, these aberration coefficients change according to each inclination angle.

Next, the aberration characteristic compensation lens 20 is operated. The aberration characteristic compensation lens 20 and the aberration generation lens 09 are adjusted simultaneously, according to the secondary electron focusing lens 21 and the objective lens 14, such that the following formula (2) is realized while the focusing point P3 of the primary electron is maintained, and the following formula (2) is realized.

$$\frac{C'^{OBJ}_s}{C'^{OBJ}_c} = \frac{C'^{COR}_s}{C'^{COR}_c} \quad (2)$$

A spherical surface and a chromatic aberration coefficient of the objective lens system defined by the object plane Zm of the objective lens, including the secondary electron focusing lens 21, are set to $C'^{OBJ}_S$ and $C'^{OBJ}_C$ and a spherical aberration coefficient and a chromatic aberration coefficient of the combined lens of the aberration generation lens 09 and the aberration characteristic compensation lens 20 are set to $C'^{COR}_S$ and $C'^{COR}_C$.

By this operation, a focusing position of the secondary electron when the beam is not inclined can be set to the center P3 of the secondary electron deflection EXB 22, with respect to any working distance, the lens strength of the objective lens 14, and the strengths of the acceleration electric field of the booster electrode 33 and the deceleration electric field of the sample 16.

Figure 12:
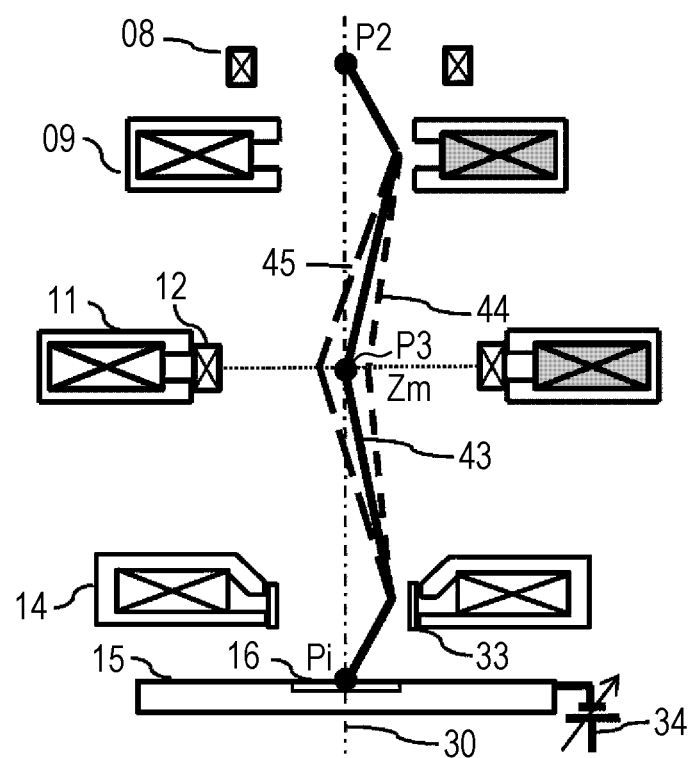
FIG. 12 is a diagram illustrating a center orbit of a primary electron at the time of beam inclination in the first embodiment.

Next, an operation when the beam is inclined will be described. FIG. 12 illustrates a center orbit of the primary electron when the beam is inclined. A primary electron 43 is deflected by the aberration generation deflector 08 with the object plane point P2 of the aberration correction lens 09 as the center, and passes through an off-axis portion of the aberration correction lens 09. Then, the primary electron 43 crosses the optical axis on the center point P3 of a symmetry plane Zm of the objective lens 14, reverses back at an inclination deflector 12 where the center is matched with the P3, passes through an off-axis portion of the objective lens 14, and is inclined and emitted to the sample 16.

At this time, the primary electron having passed through the off-axis portion of the aberration generation lens 09 receives the primary off-axis chromatic aberration and is dispersed in a primary electron 44 having high energy and a primary electron 45 having low energy. In the high-order off-axis chromatic aberration suppression lens 11 disposed on the object plane Zm of the objective lens 14, the lens strength is set such that the primary electron dispersed by the aberration generation lens 09 is focused on a principal surface of the objective lens 14. Because the formula (2) is realized, correction of the primary off-axis chromatic aberration and the deflection frame aberration and suppression of the high-order off-axis chromatic aberration are performed. When the inclination angle and the inclination direction are changed, the deflection angle and the deflection direction of the primary electron 43 by the aberration generation deflector 08 and the inclination deflector 12 are changed.

Next, an excitation current of the objective lens 14 is adjusted to correct field curvature generated when the primary electron passes through the off-axis portion of the objective lens 14. Because the lens strength of the objective lens 14 becomes weak, a focusing point of the secondary electron 42 of the energy to be targeted is shifted to a point on the point P3 of the object plane Zm of the objective lens 14.

Next, similar to the adjustment at the time of the non-inclination, the secondary electron focusing lens 21 and the objective lens 14 are adjusted simultaneously and the secondary electron 42 is focused on the point P3 on the object plane Zm of the objective lens 14 while the primary electron is focused on the point Pi on the sample. Because the adjustment is different according to the inclination angle, an aberration coefficient changes according to each inclination angle and a ratio thereof changes. A spherical surface and a chromatic aberration coefficient of the objective lens system defined by the object plane Zm of the objective lens, including the secondary electron focusing lens 21, are set to $C'^{OBJ}_S(\theta)$ and $C'^{OBJ}_C(\theta)$ as functions of an inclination angle θ.

Next, the aberration characteristic compensation lens 20 is operated. The aberration characteristic compensation lens 20 and the aberration generation lens 09 are adjusted simultaneously for each inclination angle, according to the changes in the secondary electron focusing lens 21 and the objective lens 14, such that the following formula (3) is realized while the focusing point P3 of the primary electron is maintained.

$$\frac{C'^{OBJ}_S(\theta)}{C'^{OBJ}_C(\theta)} = \frac{C'^{COR}_S(\theta)}{C'^{COR}_C(\theta)} \quad (3)$$

However, a spherical aberration coefficient and a chromatic aberration coefficient of a combined lens of the aberration generation lens 09 and the aberration characteristic compensation lens 20 defined by the object plane Zm of the objective lens when the inclination angle is θ are set to $C'^{COR}_S(\theta)$ and $C'^{COR}_C(\theta)$, respectively.

According to this embodiment, simultaneous correction of the primary off-axis chromatic aberration and the deflection frame aberration and suppression of generation of the high-order off-axis chromatic aberration can be realized with respect to any beam inclination angle and any beam inclination direction and the secondary electron focusing point can be fixed to the position of the secondary electron deflection EXB 22 and the geometric aberration received by the secondary electron is minimized. Because the size of the detection surface of the deflector 17 is finite, the strengths of the secondary electron focusing lens 21 and the objective lens 14 are adjusted such that the secondary electron orbit expanded as a distance from the optical axis increases does not deviate from the detection surface. Therefore, high-efficient detection of the secondary charged particle can be realized without depending on an inclination degree of the beam.

In addition, if the secondary electron is deflected by the secondary electron EXB 22, the chromatic dispersion is generated in the primary electron. In this embodiment, the secondary electron deflection EXB 22 is disposed such that the object plane Zm and the center of the objective lens are matched. For this reason, the chromatic dispersion generated in the primary electron when the secondary electron 42 is deflected by the secondary electron deflection EXB 22 is focused on the sample by the objective lens 14 and becomes zero. In addition, in the low angle inclination and deflection in which both the inclination angle of the primary electron and the secondary electron deflection angle are equal to or lower than 10°, the high-order off-axis chromatic aberration by the chromatic aberration of the primary electron by the secondary electron EXB 22 does not become notable. In addition, because the primary electron is focused on the center of the secondary electron deflection EXB 22, the focus action, the astigmatic image formation, and the influence of the secondary aberration of secondary electron deflection EXB 22 on the primary electron are minimized.

In this embodiment, even though the inclination angle is changed, the object plane Zm of the objective lens 14 is matched with the center of the secondary electron deflection EXB 22. Therefore, in the low angle inclination and deflection in which both the inclination angle of the primary electron and the secondary electron deflection angle are equal to or lower than 10°, the degradation of the resolution at the time of the beam inclination by the operation of the secondary electron EXB deflection 22 does not become notable.

According to this embodiment, a beam inclination optical system that can determine the energy of the secondary electron by minimizing the geometric aberration received by the secondary electron from the secondary electron deflector 22 while correcting the aberration of the primary electron at the time of the beam inclination can be provided.

In this embodiment, the inclination deflector 12 and the secondary electron deflection EXB 22 in which a deflection field generated at each inclination angle and inclination direction is different disposed on the object plane Zm of the objective lens. For this reason, the secondary electron deflection EXB generates the deflection field to cancel the deflection action applied from the inclination deflector 12 to the secondary electron, in a state in which a condition of moving the primary electron linearly is maintained.

In addition, in this embodiment, the inclination deflector 12 and the secondary electron deflection EXB 22 may be one deflection unit.

In this embodiment, the secondary electron focusing lens 21 is disposed on the objective lens 14 and the aberration characteristic compensation lens 20 is disposed below the aberration generation lens 09. However, the secondary electron focusing lens 21 and the aberration characteristic compensation lens 20 may be disposed at the opposite sides.

In this embodiment, when the energy of the secondary electron to be targeted is changed by changing the energy region of the secondary electron to perform the determination or the acceleration voltage, the retarding voltage, and the working distance are changed, adjustment of the focusing position of the secondary electron 42 at the time of the non-inclination may be performed again.

In addition, in this embodiment, a plurality of detectors 17 may be disposed and a detector in which a detection characteristic is changed, a detector to which an energy filter function is added, and a spectroscope may be formed simultaneously. At this time, when the detector is switched, the deflection direction and angle of the secondary electron 42 by the secondary electron deflection EXB 22 may be set individually to each detector.

In addition, in this embodiment, the focusing point of the secondary electron 42 is fixed to the an object plane Zm of the objective lens 14 by adjusting the strengths of the objective lens 14 and the secondary electron focusing lens 21. However, instead of the objective lens 14, the acceleration voltage of the booster electrode 33 or the retarding voltage of the sample 16 may be adjusted in cooperation with the secondary electron focusing lens 21.

Each of the aberration characteristic compensation lens 20, the secondary electron focusing lens 21, the aberration generation lens 09, and the high-order off-axis chromatic aberration suppression lens 11 may be any one of an electrostatic lens, a magnetic field lens, and electromagnetic superimposing lens. In addition, each of the aberration generation deflector 08 and the inclination deflector 12 may be any one of an electrostatic deflector and a magnetic field deflector.

Second Embodiment

Figure 2:
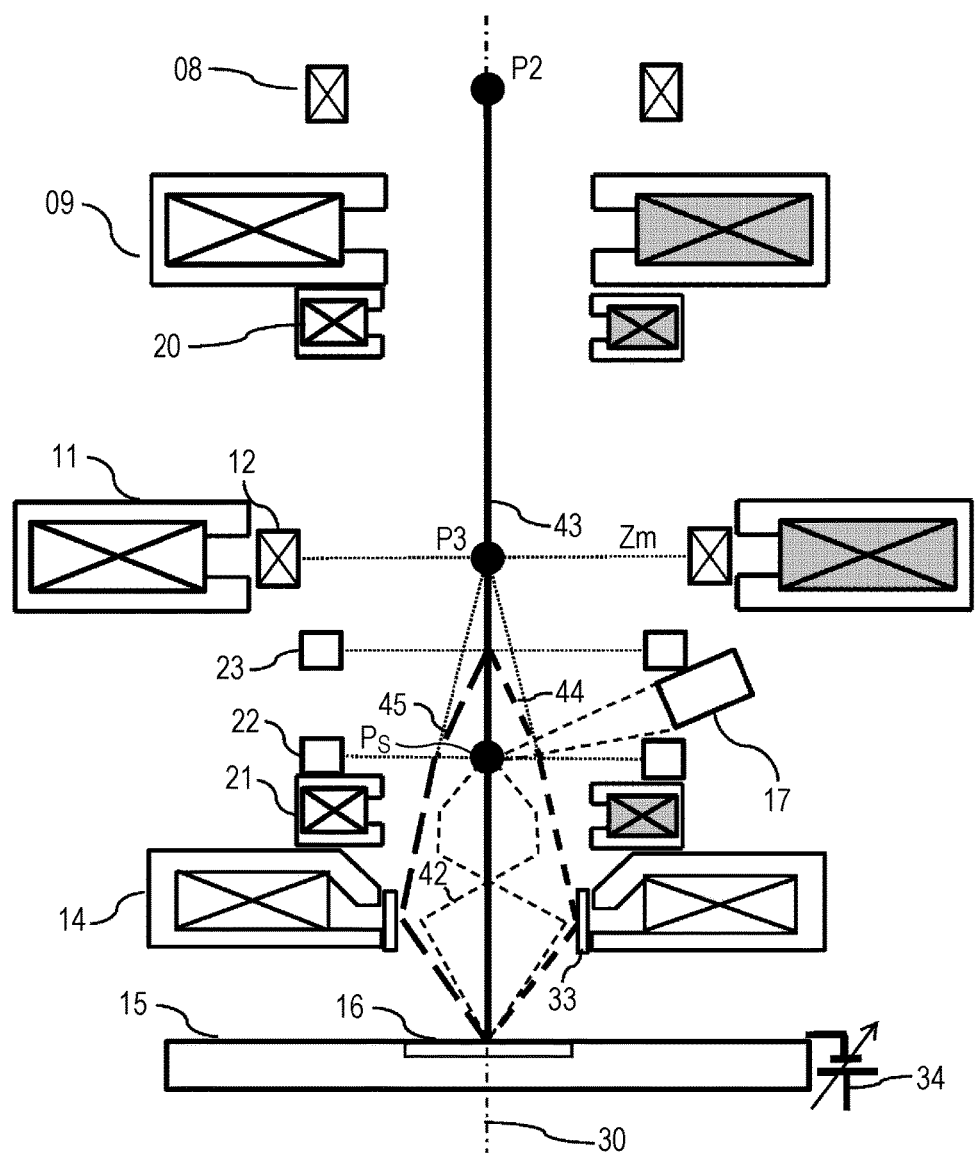
FIG. 2 is a schematic diagram of a configuration of an optical system according to a second embodiment.

In this embodiment, a preferable configuration is provided with respect to the case in which a secondary electron deflection EXB 22 cannot be disposed on an object plane Zm of an objective lens 14, from design limitations in the first embodiment. FIG. 2 is an outline diagram of a configuration of an optical system according to this embodiment. In this embodiment, the secondary electron deflection EXB 22 is disposed between a high-order off-axis chromatic aberration suppression lens 11 and a secondary electron focusing lens 21 disposed on the object plane Zm of the objective lens 14. In addition, a dispersion adjustment EXB 23 is disposed newly between the secondary electron deflection EXB 22 and the high-order off-axis chromatic aberration suppression lens 11. A deflector 17 is disposed between the dispersion adjustment EXB 23 and the secondary electron deflection EXB 22.

In this embodiment, the strengths of the objective lens 14 and the secondary electron focusing lens 21 are adjusted such that a secondary electron 42 is focused on a center point Ps of the secondary electron deflection EXB 22 and the object plane Zm of the objective lens 14 is fixed. The lens strengths of an aberration generation lens 09 and an aberration characteristic compensation lens 20 are adjusted for each inclination angle, such that the formula (3) is realized at all times while the object plane Zm of the objective lens 14 is fixed. As a result, correction of primary off-axis chromatic aberration and deflection frame aberration of a primary electron at the time of beam inclination and suppression of high-order off-axis chromatic aberration are realized and a focusing position of a secondary electron is fixed to a center Ps of the secondary electron deflection EXB 22. The secondary electron 42 is deflected to the detector 17 by the secondary electron deflection EXB 22.

However, because the secondary electron deflection EXB 22 is separated from the object plane Zm of the objective lens 14, chromatic dispersion applied from the secondary electron deflection EXB to the primary electron becomes notable. A dispersion adjustment EXB 23 causes a primary electron having average energy to move linearly and an origin of dispersion of a primary electron having different energy having passed through the secondary electron deflection EXB 22 is adjusted to become a center point P3 of the object plane Zm of the objective lens 14 virtually. As a result, chromatic dispersion of the primary electron generated by the dispersion adjustment EXB 23 and the secondary electron deflection EXB 22 is focused on a sample 16 by the objective lens 14, becomes zero, and does not become notable.

In this embodiment, because the primary electron disperses on the secondary electron deflection EXB 22 and the dispersion adjustment EXB 23, the primary electron receives lens action and astigmatic image formation action of the EXB. However, in this embodiment, the strengths of the secondary electron deflection EXB 22 and the dispersion adjustment EXB 23 are fixed without depending on an inclination angle and an inclination direction. Therefore, the astigmatic image formation action can be corrected by adjustment of an astigmatism corrector 07 at the time of non-inclination. In addition, adjustment of the objective lens 14, the secondary electron focusing lens 21, the aberration generation lens 09, and the aberration characteristic compensation lens 20 may be performed in addition to the lens action of the secondary electron deflection EXB 22 and the dispersion adjustment EXB 23.

Third Embodiment

In this embodiment, a preferable configuration in which high-order off-axis chromatic aberration is not generated is provided with respect to the case in which chromatic dispersion applied from a secondary electron deflection EXB 22 to a primary electron causes high-order off-axis chromatic aberration at the time of beam inclination to become notable, when each of an inclination angle and a secondary electron deflection angle is a large angle equal to or higher than 10°, in the first embodiment.

Figure 3:
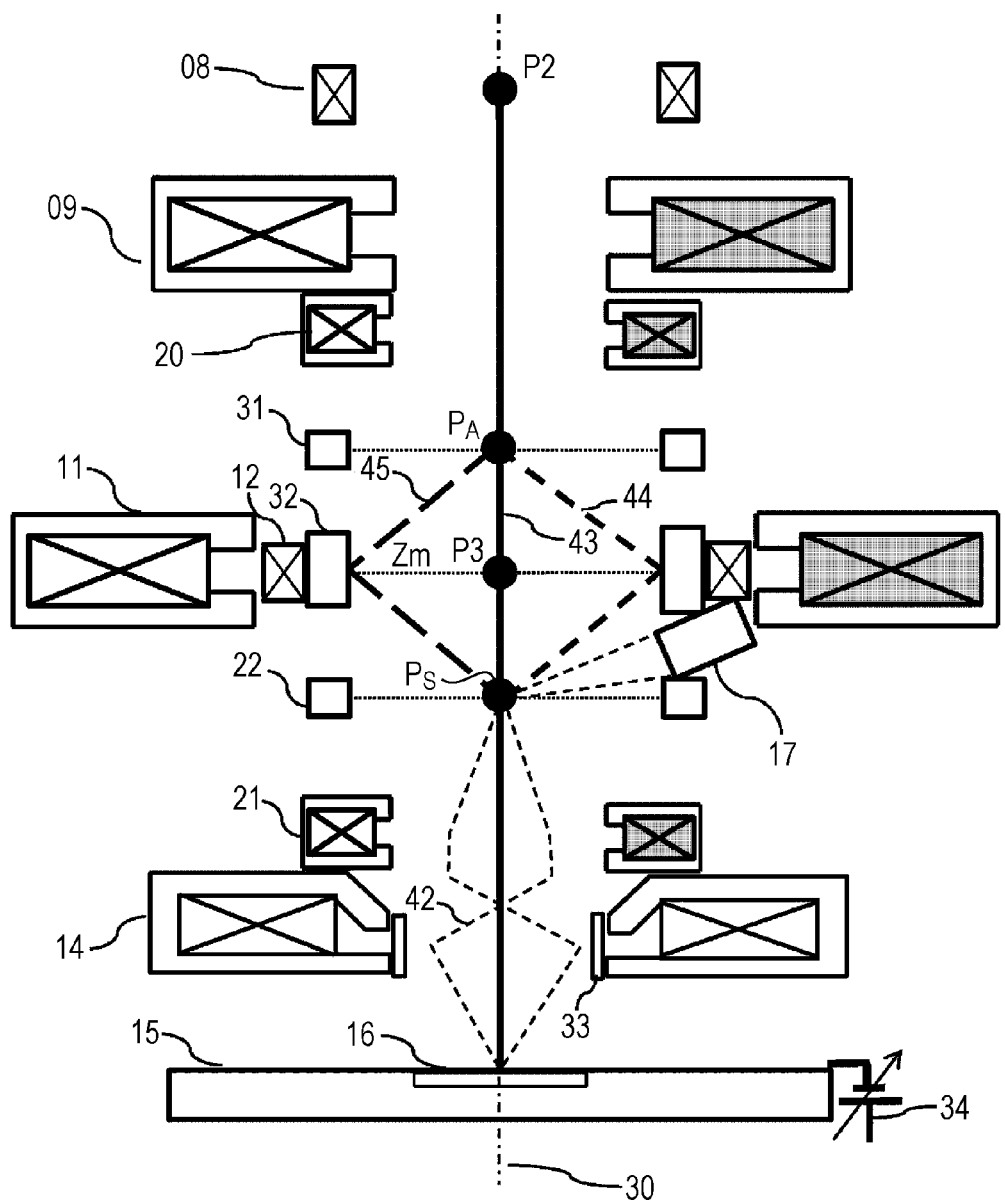
FIG. 3 is a schematic diagram of a configuration of an optical system according to a third embodiment.

FIG. 3 is a schematic diagram of a configuration according to this embodiment. In this embodiment, the secondary electron deflection EXB 22 is disposed between a high-order off-axis chromatic aberration suppression lens 11 and a secondary electron focusing lens 21 disposed on an object plane Zm of an objective lens 14. A detector 17 is disposed between the high-order off-axis chromatic aberration suppression lens 11 and the secondary electron deflection EXB 22. In addition, a second dispersion compensation EXB 32 is disposed at the same position as the high-order off-axis chromatic aberration suppression lens 11. A first dispersion compensation EXB 31 to be an EXB having the same configuration as the secondary electron deflection EXB 22 is disposed at a position symmetrical to the secondary electron deflection EXB 22 with the object plane Zm of the objective lens 14 therebetween.

In this embodiment, similar to the second embodiment, adjustment of the objective lens 14, the secondary electron focusing lens 21, an aberration generation lens 09, and an aberration characteristic compensation lens 20 is performed in addition to lens action of the secondary electron deflection EXB 22 and the first dispersion compensation EXB 31 and a focusing point of a secondary electron 42 is fixed to a center point Ps of the secondary electron deflection EXB 22.

The secondary electron deflection EXB 22 and the first dispersion compensation EXB 31 have the same configuration and the strengths of generated dipole magnetic fields are also the same in the secondary electron deflection EXB 22 and the first dispersion compensation EXB 31. However, generation directions of the dipole magnetic fields are rotated by a rotation angle when a high-order off-axis chromatic aberration suppression lens 11 is a magnetic field lens.

Action of the EXB for a primary electron will be described. Chromatic dispersion is generated in the primary electron by the first dispersion compensation EXB 31. The chromatic aberration is generated with a center $P_A$ of the first dispersion compensation EXB 31 as an origin. The second dispersion compensation EXB 32 generates a dipole field, such that the chromatic aberration generated by the first dispersion compensation EXB 31 is focused on the center Ps of the secondary electron deflection EXB 22, including lens action of the high-order off-axis chromatic aberration suppression lens 11. In addition, the chromatic aberration of the secondary electron deflection EXB 22 is added and the chromatic aberration is completely corrected after passing through the secondary electron deflection EXB 22. Therefore, the chromatic aberration of the secondary electron deflection EXB is zero on a principal surface of the objective lens 14 and high-order off-axis chromatic aberration is not generated when a beam is inclined at a large angle and when a secondary electron is deflected at a large angle.

In addition, in this embodiment, strengths, directions, and distributions of electromagnetic fields of the secondary electron deflection EXB 22 and the first dispersion compensation EXB 31 to which the primary electron diffuses are symmetrical to a focusing surface of the primary electron. Therefore, secondary aberrations of the secondary electron deflection EXB 22 and the first dispersion compensation EXB 31 with respect to the primary electron are corrected simultaneously.

In addition, in this embodiment, a symmetrical arrangement of the secondary electron deflection EXB 22 and the first dispersion compensation EXB 31 is not limited. The three EXBs of the secondary electron deflection EXB 22, the second dispersion compensation EXB 32, and the first dispersion compensation EXB 31 are disposed sequentially from the lower side. If the strength and the direction of the dipole field of each EXB are appropriately set, the chromatic aberration by the EXB can be completely corrected, regardless of the distribution of the electromagnetic field and the arrangement, and large angle inclination and large angle deflection of the secondary electron can be realized in a range in which the secondary aberration of the EXB is not notable.

Fourth Embodiment

In the first to third embodiments, the aberration to correct the aberration of the objective lens at the time of the beam inclination is generated by the aberration generation lens 09 and the aberration generation deflector 08 to cause the primary electron to pass through an off-axis portion and suppression of high-order off-axis chromatic aberration at the time of the beam inclination is realized by a lens.

A unit to realize generation of the correction aberration and suppression of the high-order off-axis chromatic aberration at the time of the beam inclination is not limited to the above configuration and a multipole may be used. In this embodiment, the case in which an aberration correction multipole is used as the unit to generate the aberration at the time of the inclination and a multipole to generate a quadrupole field is used as an optical element to suppress the high-order off-axis chromatic aberration will be described.

Figure 4:
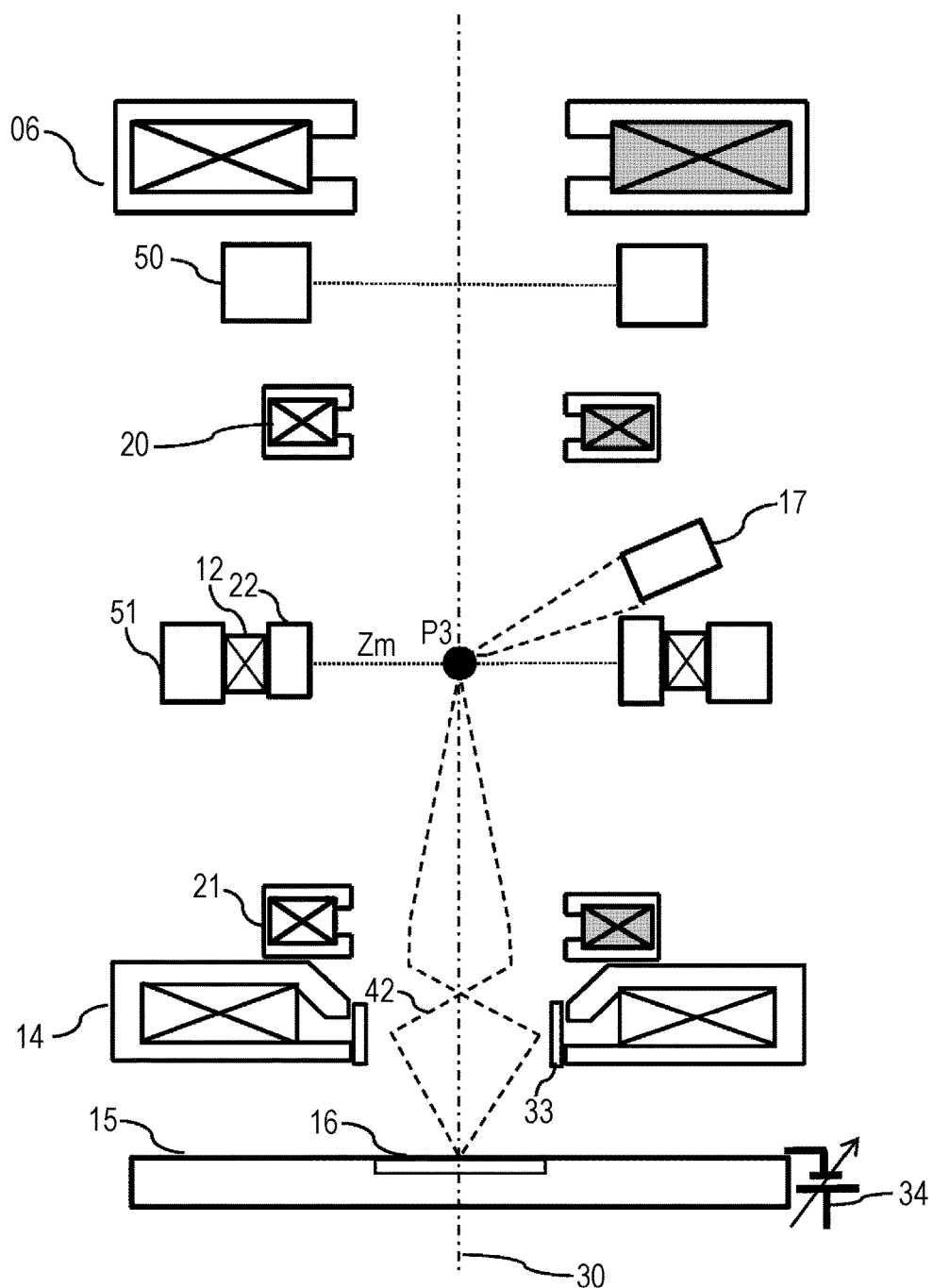
FIG. 4 is a schematic diagram of a configuration of an optical system according to a fourth embodiment.

FIG. 4 is a schematic diagram of a configuration according to this embodiment. In this embodiment, instead of the aberration generation lens 09, an aberration generation multipole 50 is disposed between an aberration characteristic compensation lens 20 and a second condenser lens 06 in the configuration of the optical system according to the first embodiment. An inclination deflector 12, a secondary electron deflection EXB 22, and a high-order off-axis chromatic aberration suppression multipole 51 are disposed on an object plane Zm of an objective lens 14.

A primary electron diffuses appropriately on the aberration generation multipole 50, the primary electron is focused on a center point P3 of the high-order off-axis chromatic aberration suppression multipole 51, and aberration unnecessary for the primary electron is not generated.

The aberration generation multipole 50 is adjusted to generate chromatic aberration and frame aberration equivalent to the objective lens 14 on the object plane Zm of the objective lens 14.

Similar to the first embodiment, the objective lens 14 and the secondary electron focusing lens 21 operate in cooperation with each other to focus the primary electron on a sample and focus a secondary electron 42 on a center point P3 of the secondary electron deflection EXB 22, according to a beam inclination angle.

In addition, strengths of the aberration generation multipole 50 and the aberration characteristic compensation lens 20 are adjusted for each inclination angle, such that the primary electron is focused on the center point P3 of the high-order off-axis chromatic aberration suppression multipole 51 at all times for each inclination angle and direction and chromatic aberration and secondary frame aberration having the same amount and a reverse sign as compared with an objective lens system are generated.

The high-order off-axis chromatic aberration suppression multipole 51 generates the quadrupole field. The chromatic aberration generated by the aberration generation multipole 50 is focused on a principal surface of the objective lens 14 to correct the chromatic aberration at the time of beam inclination by astigmatic image formation action. As a result, generation of the high-order off-axis chromatic aberration is suppressed. When an inclination angle and an inclination direction of a beam are changed, a multipole strength and a direction of the aberration generation multipole 50 may be changed and a direction of the quadrupole field of the high-order off-axis chromatic aberration suppression multipole 51 may be changed.

In this embodiment, because the secondary electron deflection EXB 22 is disposed on the object plane Zm of the objective lens 14, similar to the first embodiment, the chromatic aberration applied from the secondary electron deflection EXB 22 to the primary electron becomes zero on the sample 16 and does not become notable. Therefore, there is no problem in low angle inclination and low angle deflection of the secondary electron.

When large angle inclination and large angle deflection of the secondary electron are performed, dispersion compensation EXBs may be disposed in two steps on the secondary electron deflection EXB 22, as in the third embodiment.

A unit in which a deflector is added between the second condenser lens 06 and the aberration generation multipole 50 may be used as an aberration generation unit and a generation ratio of the chromatic aberration and the frame aberration may be adjusted by causing the primary electron to pass through an off-axis portion of the aberration generation multipole 51.

The aberration generation multipole 50 and the high-order aberration suppression multipole 51 in this embodiment may be of an electrostatic type, a magnetic field type, or an electromagnetic superimposition type.

Fifth Embodiment

In this embodiment, the case in which a Wien filter is used as a unit to generate aberration at the time of beam inclination and an optical element to suppress high-order off-axis chromatic aberration will be described.

Figure 5:
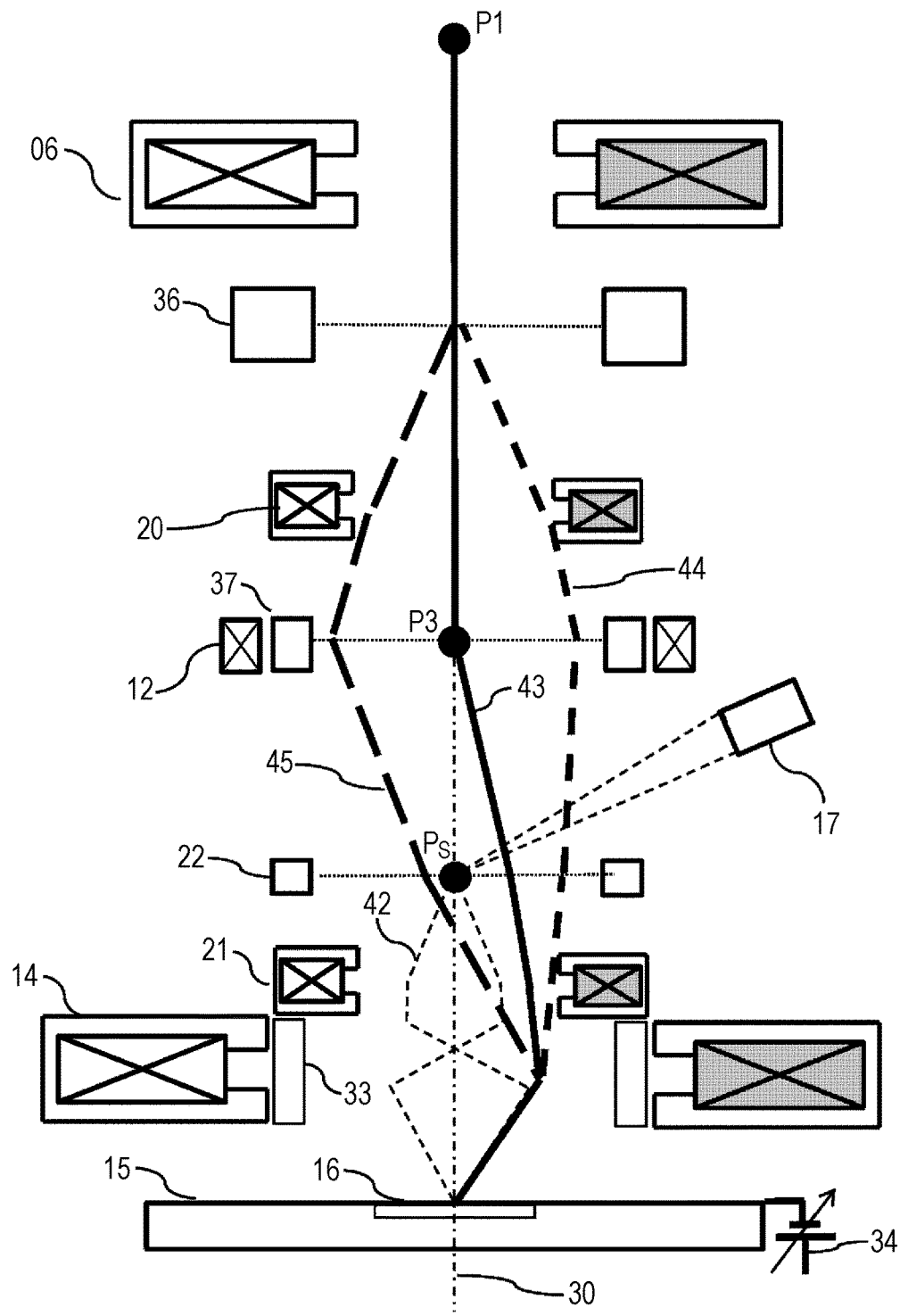
FIG. 5 is a schematic diagram of a configuration of an optical system according to a fifth embodiment.

FIG. 5 is a schematic diagram of a configuration according to a fifth embodiment. In this embodiment, instead of an aberration generation lens 09, an aberration generation Wien filter 36 is disposed between an aberration characteristic compensation lens 20 and a second condenser lens 06. An inclination deflector 12 and a high-order off-axis chromatic aberration suppression Wien filter 37 are disposed on an object plane Zm of an objective lens 14. A deflection field of the inclination deflector 12 may be superimposed on the high-order off-axis chromatic aberration suppression Wien filter 37. In addition, a secondary electron deflection EXB 22 is disposed between a secondary electron focusing lens 21 and the high-order off-axis chromatic aberration suppression Wien filter 37 and a detector 17 is disposed between the secondary electron deflection EXB 22 and the high-order off-axis chromatic aberration suppression Wien filter 37.

A primary electron diffuses appropriately on the aberration generation Wien filter 36, the primary electron is focused on a center point P3 of the high-order off-axis chromatic aberration suppression Wien filter 37, and aberration unnecessary for the primary electron is not generated.

The aberration generation Wien filter 36 generates chromatic aberration and secondary aberration of the primary electron, according to strength and a direction of a dipole field. In this configuration, secondary frame aberration of the generated secondary aberration is used for aberration correction at the time of beam inclination in the objective lens 14. The aberration generation Wien filter 36 is adjusted to generate chromatic aberration and secondary frame aberration equivalent to the objective lens 14 on the object plane Zm of the objective lens 14.

Similar to the first embodiment, the objective lens 14 and the secondary electron focusing lens 21 operate in cooperation with each other to focus the primary electron on a sample and focus a secondary electron 42 on a center point Ps of the secondary electron deflection EXB 22, according to a beam inclination angle.

In addition, strengths of the aberration generation Wien filter 36 and the aberration characteristic compensation lens 20 are adjusted for each inclination angle, such that the primary electron is focused on a center point P3 of the high-order off-axis chromatic aberration suppression Wien filter 37 at all times for each inclination angle and direction and chromatic aberration and secondary frame aberration having the same amount and a reverse sign as compared with an objective lens system are generated.

The high-order off-axis chromatic aberration suppression Wien filter 37 is operated to generate a dipole field, such that the chromatic aberration generated by the aberration generation Wien filter 36 is focused on a principal surface of the objective lens 14. When an inclination angle and an inclination direction are changed, generation strengths and directions of the dipole field and the quadrupole field of the aberration generation Wien filter 36 and the high-order off-axis chromatic aberration suppression Wien filter 37 may be changed.

Next, correction of chromatic aberration of a secondary electron orbit will be described. In this embodiment, the first dispersion compensation EXB 31 and the second dispersion compensation EXB 32 according to the third embodiment are replaced by the aberration generation Wien filter 36 and the high-order off-axis chromatic aberration suppression Wien filter 37, respectively. The dipole field may be superimposed such that the aberration generation Wien filter 36 and the high-order off-axis chromatic aberration suppression Wien filter 37 generate the chromatic aberration in the deflection direction of the secondary electron to correct the chromatic aberration generated in the primary electron by the operation of the secondary electron deflector 22. The strength and the direction of the superimposed field are set according to the energy, the deflection direction, and the deflection angle of the secondary electron to be targeted. As a result, generation of high-order off-axis chromatic aberration of the primary electron at the time of the beam inclination is suppressed.

According to this embodiment, even though the Wien filter is used as the aberration generation unit and the high-order off-axis chromatic aberration suppression optical element, both the aberration correction of the primary electron at the time of the beam inclination and control of a focusing position for high-precision determination of the secondary electron are realized.

A unit in which a deflector is added between the second condenser lens 06 and the aberration generation Wien filter 36 may be used as an aberration generation unit and a generation ratio of the chromatic aberration and the secondary frame aberration may be adjusted by causing the primary electron to pass through an off-axis portion of the aberration generation Wien filter 36.

In the first to fifth embodiments, the aberration generation optical element may be any one of the lens, the multipole, and the Wien filter. In addition, the high-order off-axis chromatic aberration suppression optical element may be any one of the lens, the multipole capable of generating the quadrupole field, and the Wien filter.

Sixth Embodiment

In this embodiment, an example of a configuration to match the centers of the high-order chromatic aberration suppression lens 11 and the secondary electron deflection EXB 22 and arrange the high-order chromatic aberration suppression lens 11 and the secondary electron deflection EXB 22 at the same position, in the configuration of the first embodiment, will be described.

Figure 6A:
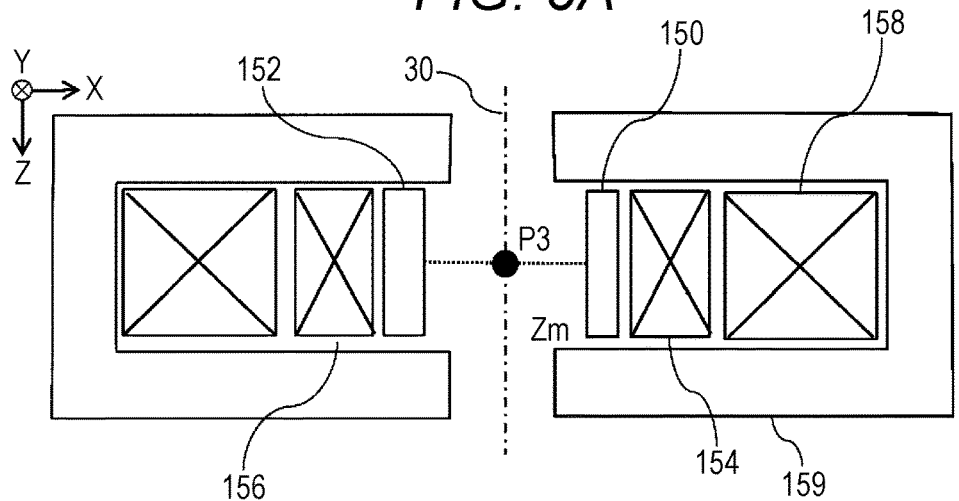
FIGS. 6A and 6B are configuration diagrams of a secondary electron deflection EXB unit according to a sixth embodiment.
Figure 6B:
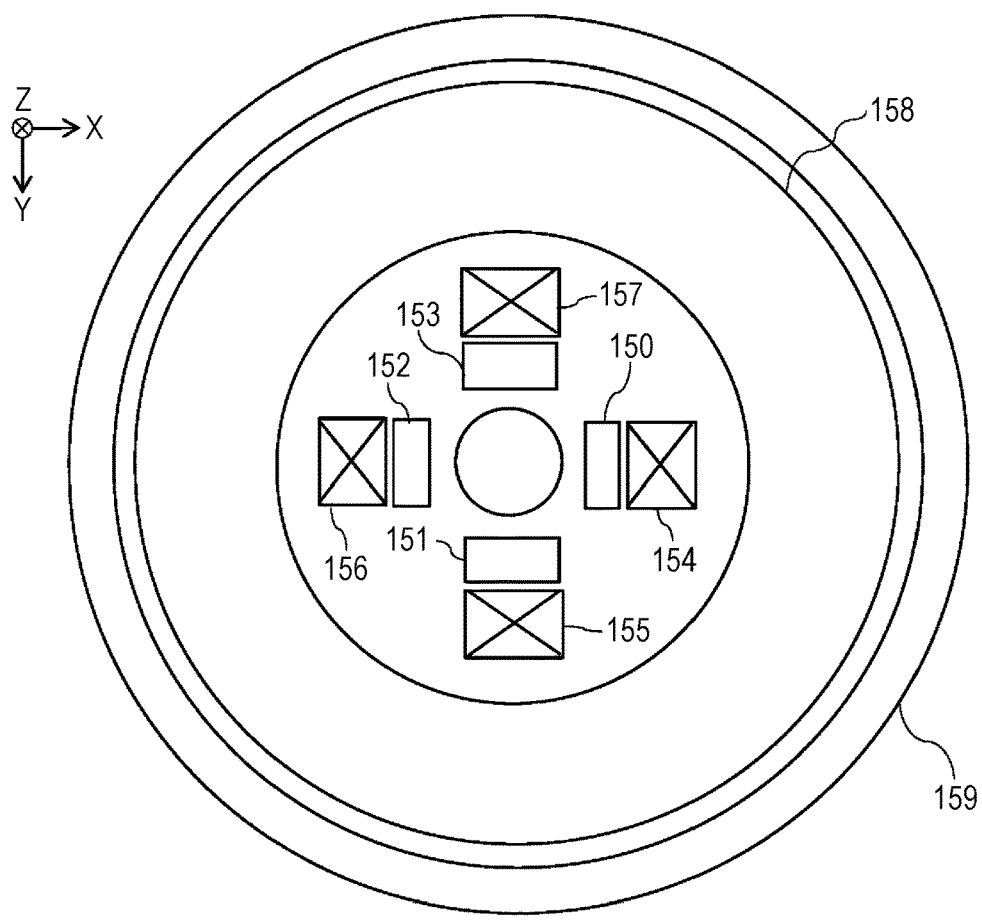

FIGS. 6A and 6B are cross-sectional views illustrating configurations of a lens and an EXB according to this embodiment. FIG. 6A is an XZ cross-sectional view and FIG. 6B is an XY cross-sectional view at a position of an object plane Zm of an objective lens 14. Electrodes 150 to 153 made of a paramagnetic metal are disposed with the object plane Zm as a center of symmetry of a Z direction, deflection coils 154 to 157 not using a ferromagnetic core in a winding type are disposed at the outside thereof, and the EXB is formed. In addition, a coil 158 for a magnetic field circular lens is disposed at the outside of the EXB and a component material is cased with a circular lens magnetic path 159 of a ferromagnetic metal. Although not illustrated in the drawings, a power supply to supply a voltage and a current to generate a deflected dipole electric field, a deflected dipole magnetic field, and a circular lens magnetic field is connected to each electrode and coil. The power supply is controlled by a secondary electron deflection EXB control unit 110.

In the configuration according to this embodiment, the electrode to generate the deflected dipole electric field of the EXB is disposed at the innermost side, so that the generated electric field can be prevented from being electrostatically shielded. In addition, the paramagnetic metal is used as the electrode material, so that generation of the dipole magnetic field or the circular lens magnetic field is not obstructed. In addition, the deflection coils 154 to 157 to generate the dipole magnetic field do not use the ferromagnetic core in the winding type, so that the deflected dipole magnetic field can be generated without disturbing the generation of the circular lens magnetic field by the coil 158 for the circular lens disposed at the innermost side.

In this embodiment, generation of a multipole field equal to or more than a hexapole field may be suppressed by setting the number of electrodes of the secondary electron deflection EXB to 8 to 12 or adjusting an orientation distribution of the number of turns of the deflection coil.

Seventh Embodiment

In this embodiment, a second configuration to match the centers of the high-order chromatic aberration suppression lens 11 and the secondary electron deflection EXB 22 and arrange the high-order chromatic aberration suppression lens 11 and the secondary electron deflection EXB 22 at the same position, in the configuration of the first to third embodiments, will be described.

Figure 7:
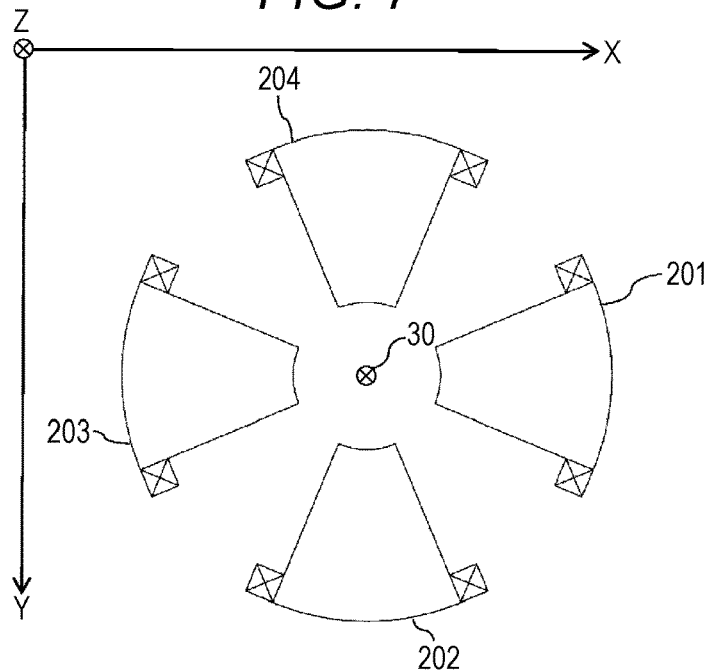
FIG. 7 is a configuration diagram of a secondary electron deflection Wien filter unit according to a seventh embodiment.

In this embodiment, an electrode and a magnetic pole of a secondary electron deflection EXB is configured as a common electromagnetic pole, distributions of an electric field and a magnetic field are matched, and a Wien filter unit is configured. FIG. 7 is a cross-sectional view illustrating a configuration of the Wien filter unit. In this embodiment, four electromagnetic poles 201, 202, 203, and 204 are disposed to rotate by 90° in an orientation direction. Each electromagnetic pole is made of a ferromagnetic metal and a magnetic field excitation coil is wound around each electromagnetic pole. Direct-current power supplies are connected to each electromagnetic pole and each coil independently.

If the same voltage is applied to the electromagnetic poles 201 to 204, the four electromagnetic poles have the same potential and an electrostatic circular lens field is generated. However, an electrostatic octopole field is generated simultaneously. In the case of a positive voltage, an acceleration lens field is generated and in the case of a negative voltage, a deceleration lens field is generated.

In a state in which the voltage to generate the electrostatic circular lens field is applied to all of the electromagnetic poles, the voltage is superimposed on the electromagnetic poles 201 to 204 independently, so that a dipole electric field can be generated in any direction. In addition, a current is appropriately flown to the electromagnetic pole excitation coil, so that the dipole electric field can be generated in any direction.

In addition, this embodiment is preferable as the configurations of the EXB and the Wien filter used in the first to fourth embodiments.

Eighth Embodiment

Figure 8:
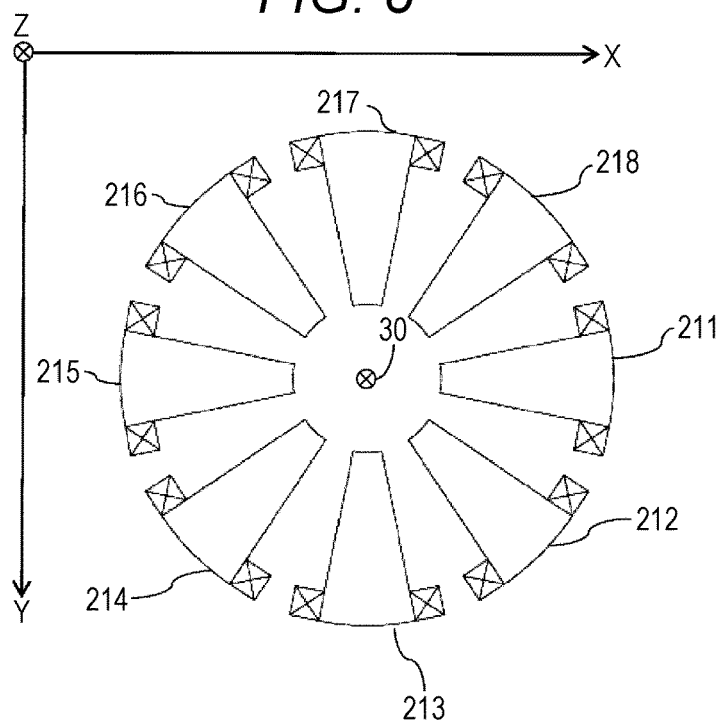
FIG. 8 is a configuration diagram of a secondary electron deflection Wien filter unit according to an eighth embodiment.

In the Wien filter unit illustrated in the seventh embodiment, the electrostatic circular lens field and the electrostatic octopole field are generated. The octopole field generates third-order geometric aberration and third-order chromatic aberration. If a beam inclination angle or a secondary electron deflection angle increases, these aberrations may become notable. For this reason, here, a Wien filter unit using eight electromagnetic poles is described as a preferred example. FIG. 8 is a cross-sectional view illustrating a configuration according to this embodiment.

The Wien filter unit includes eight electromagnetic poles 211 to 218 and coils to excite the electromagnetic poles. Power supplies to supply a voltage and a current are connected to each electromagnetic pole and each coil independently.

If the same voltage is applied to the eight electromagnetic poles, the electrostatic circular lens field and the electrostatic hexadecapole field are generated. Aberration of the electrostatic hexadecapole field is seventh-order geometric aberration and seventh-order chromatic aberration. Because these aberrations do not cause a problem practically, these aberrations can be ignored. In this configuration, the voltage and the current are applied to the eight electromagnetic poles independently, so that the electrostatic circular lens field, the dipole electric field, the dipole magnetic field, the quadrupole electric field, and the quadrupole magnetic field can be generated in any direction.

In addition, the number of electromagnetic poles may be set to 12 and the circular lens field, the dipole field, the quadrupole field, and the hexapole field may be generated arbitrarily.

In addition, if the current is flown to an electrostatic pole excitation coil of the Wien filter unit such that all of the electromagnetic poles are excited to an N pole or an S pole, the circular lens magnetic field, the octopole magnetic field, and the hexadecapole magnetic field can be generated.

In addition, this embodiment is most preferable as the configurations of the EXB and the Wien filter used in the first to fifth embodiments. Because the quadrupole field can be freely generated in addition to the dipole field, astigmatic image formation action of the Wien filter can be cancelled in a state in which achromatism of the quadrupole is maintained. In addition, this embodiment is preferable as the configuration of the high-order off-axis chromatic aberration suppression multipole in the fourth embodiment.

Ninth Embodiment

Figure 9:
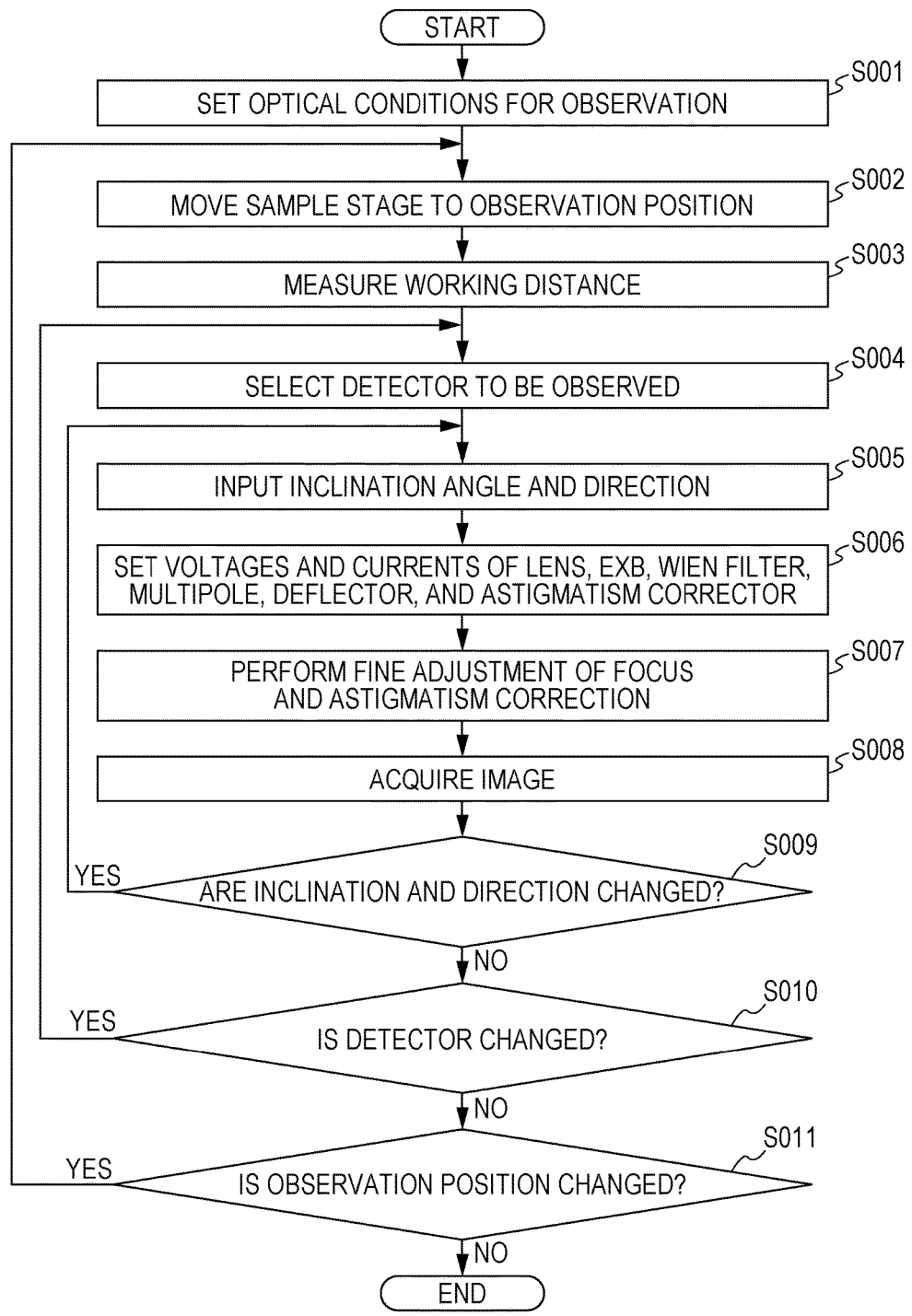
FIG. 9 is a flowchart of beam inclination in a ninth embodiment.
Figure 10:
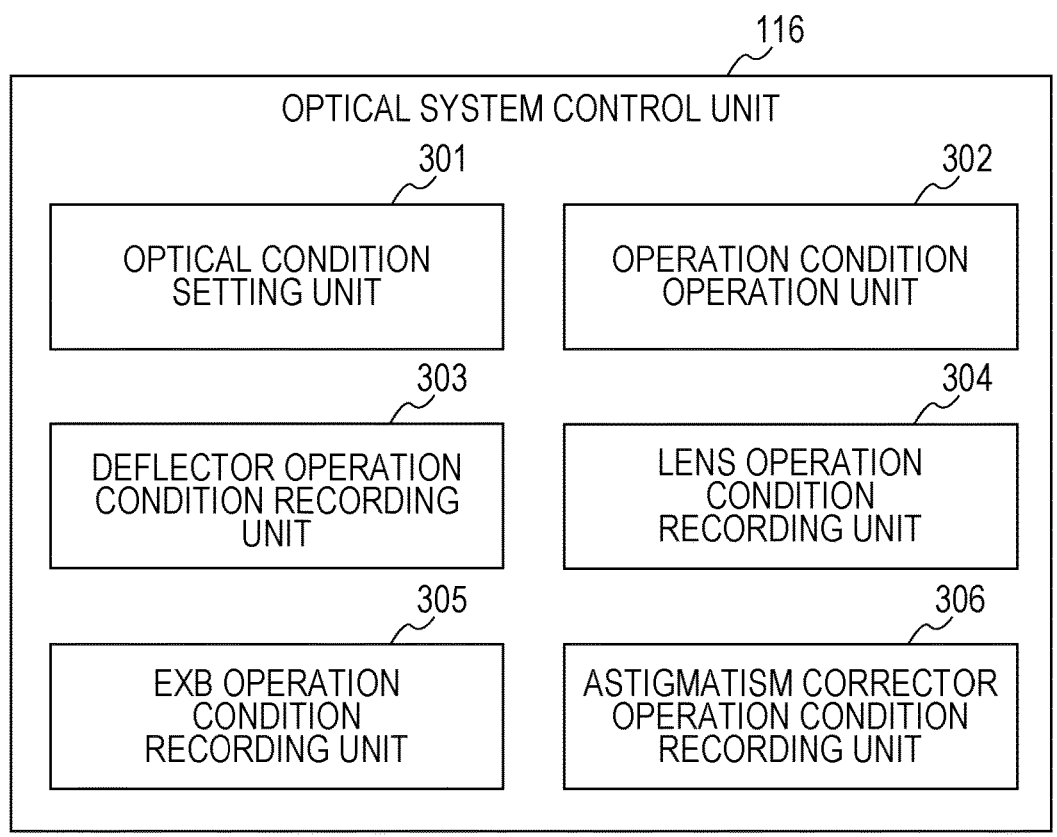
FIG. 10 is a configuration diagram of an optical system control unit.

In this embodiment, a control flow of a primary electron and a secondary electron at the time of beam inclination will be described. FIG. 10 is a diagram illustrating a configuration of an optical system control unit 116. In addition, FIG. 9 is a flowchart of the beam inclination of the primary electron according to this embodiment.

In step 001, optical conditions (an acceleration voltage, a booster voltage, a retarding voltage, and energy of a focused secondary electron) for observation are set by an optical condition setting unit 301.

In step 002, a sample stage is moved to an observation position.

In step 003, a working distance is measured by a sample height measurement device 120.

In step 004, a detector to acquire an image is selected.

In step 005, an inclination angle and an inclination direction are input.

In step 006, an operation condition table recorded in a deflector operation condition recording unit 303, a lens operation condition recording unit 304, an EXB operation condition recording unit 305, and an astigmatism corrector operation condition recording unit 306 is read according to the optical conditions set in step 001, the detector selected in step 004, and the inclination angle and the inclination direction input in step 005, a voltage and a current of each lens, each EXB, or a Wien filter, each multipole, each deflector, and an astigmatism corrector are determined by an operation condition operation unit 302 on the basis of the working distance measured in step 003, and the voltage and the current are set by each control unit.

In step 007, fine adjustment of a focus and astigmatism correction is performed. At this time, the fine adjustment of the focus is performed such that lens strength of an objective lens 14 and a secondary electron focusing lens 21 change cooperatively, a focusing position of a secondary electron does not change, and only a focus of a primary electron changes, on the basis of operation conditions operated in step 005.

In step 008, an inclined SEM image is acquired.

In step 009, it is determined whether or not to change the inclination angle and the inclination direction. When the inclination angle and the inclination direction are changed, the process returns to step 005.

In step 010, it is determined whether or not to change the detector to acquire the image. When the detector is changed, the process returns to step 004.

In step 011, it is determined whether or not to change a sample observation position. When the sample observation position is changed, the process returns to 002.

What is claimed is:

1. A charged particle beam device comprising:
   an objective lens that focuses a charged particle beam emitted from a charged particle source;
   a detector that detects a charged particle;
   a first Wien filter that deflects a charged particle emitted from the sample toward the detector;
   a second Wien filter that is disposed between the charged particle source and the first Wien filter and that generates chromatic dispersion for compensating chromatic dispersion of the charged particle beam generated by the first Wien filter;

a focusing element that is disposed between the first Wien filter and the second Wien filter and that includes at least one of a third Wien filter and a focusing lens; and a control device that controls at least one of the third Wien filter and the focusing lens;

wherein the control device controls at least one of the third Wien filter and the focusing lens so that the charged particle beam dispersed by the second Wien filter is focused on a deflection fulcrum of the first Wien filter.

2. The charged particle beam device according to claim 1, further comprising a charged particle focusing lens that is disposed between the first Wien filter and the objective lens and that focuses a charged particle emitted from the sample onto the deflection point.

3. The charged particle beam device according to claim 1, wherein:

the first Wien filter is disposed to deflect the charged particle, that is emitted from the sample, on an object plane of the objective lens.

4. The charged particle beam device according to claim 1, wherein:

an inclination deflector to deflect the charged particle beam so that a charged particle beam is emitted to the sample from a direction different from an ideal optical axis of the objective lens and an aberration correction unit to correct aberration generated by deflection of the charged particle beam by the inclination deflector is disposed between the charged particle source and the object plane of the objective lens.

5. The charged particle beam device according to claim 4, wherein:

an aberration compensation lens is disposed above the first Wien filter.

6. The charged particle beam device according to claim 1, wherein:

the first Wien filter and the second Wien filter are disposed in an optical axis of the charged particle beam while taking an object plane of the objective lens as a symmetrical surface.

7. The charged particle beam device according to claim 1, further comprising:

a control device that controls the first Wien filter and the second Wien filter so that a strength, a direction, and a distribution of an electromagnetic field generated by the first Wien filter and a strength, a direction, and a distribution of an electromagnetic field generated by the second Wien filter are symmetric with each other with respect to an object plane of the objective lens.

* * * * *